United States Patent [19]
Eitan et al.

[11] Patent Number: 6,118,267
[45] Date of Patent: Sep. 12, 2000

[54] APPARATUS FOR SWITCHING A REFERENCE VOLTAGE BETWEEN HIGH AND LOW IMPEDANCE STATES

[75] Inventors: Boaz Eitan, Ra'anana; Hans Nachmann, Netanya, both of Israel

[73] Assignee: Saifun Semiconductors Ltd., Netanya, Israel

[21] Appl. No.: 09/246,880

[22] Filed: Feb. 4, 1999

[51] Int. Cl.[7] ........................................ H03H 1/00
[52] U.S. Cl. ........................... 323/364; 327/544; 327/404
[58] Field of Search ........................... 327/544, 594, 327/403, 404; 365/226; 323/364, 269, 272

[56] References Cited

U.S. PATENT DOCUMENTS 5,568,085  10/1996  Eitan et al. ............................. 327/546
5,636,288   6/1997  Bonneville et al. .................... 363/79
5,726,946   3/1998  Yamagata et al. ..................... 365/226

OTHER PUBLICATIONS

David A. Johns, Ken Martin, "Analog Integrated Circuit Design", John Wiley & Sons Inc., Chapter 10, p. 398 and inside cover of the text. Jun. 1997.

K. Martin, "Improved Circuits for Realization of Switched-Capacitor Filters", IEEE Trans. Circuit and Systems, vol. CAS–27 No. 4, pp. 237–244, Apr. 1980.

Primary Examiner—Shawn Riley
Attorney, Agent, or Firm—Skjerven Morrill MacPherson LLP; Alan H. MacPherson

[57] ABSTRACT

A dual mode apparatus for alternately supplying a low power reference voltage and a high power reference voltage, both at the same voltage level. The apparatus includes a driver, an output buffer and a switch. The driver generates the low power reference voltage, which is directly supplied during a standby mode of a receiving unit. The output buffer receives the low power reference voltage during an active mode of the receiving unit, and generates the high power reference voltage therefrom. The switch is connected between an output of the driver and the output buffer, and provides the high power reference voltage during the active mode, and the low power reference voltage during the stand-by mode.

2 Claims, 2 Drawing Sheets

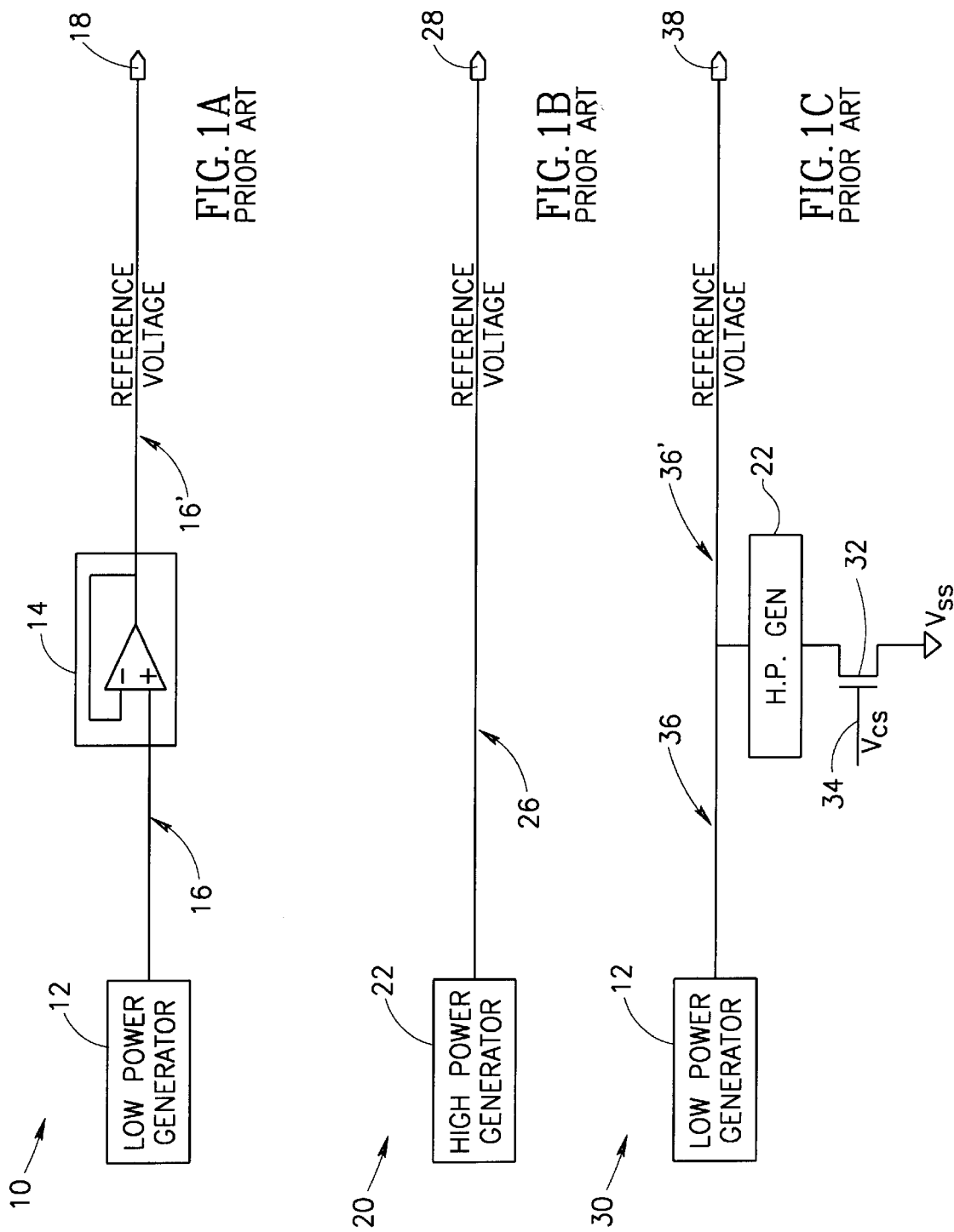

APPARATUS FOR SWITCHING A REFERENCE VOLTAGE BETWEEN HIGH AND LOW IMPEDANCE STATES

FIELD OF THE INVENTION

The present invention relates to electrical circuits in general, and to generally stable band gap reference voltages in particular

BACKGROUND OF THE INVENTION

Typically, in order to function properly, chip circuitry requires a generally stable reference voltage, such as a band gap reference voltage. Thus, whether the chip is operating in either standby mode or in active mode, the output band gap reference voltage should remain generally stable. For instance, in a memory device, the band gap reference voltage should remain relatively stable both during the absence of line activity and during functions such as read, program, or verify.

Reference is now made to FIGS. 1A, 1B, and 1C which illustrate prior art circuits which supply band gap reference voltages.

FIG. 1A illustrates a circuit 10 comprising a band gap reference generator 12 and a buffer 14. Generator 12 supplies a band gap voltage, generally referenced by arrow 16, to buffer 14, which drives the voltage and supplies an output band gap reference voltage, generally referenced by arrow 16', to an output 18. Buffer 14 is continuously on, thereby effectively eliminating noise in the output line 16 as generally experienced during typical transients in the load circuit.

Generator 12 is a low power, high resistance driver which consumes relatively little energy. However, it reacts slowly to voltage changes in the line, and thus takes a relatively long time to stabilize after initialization of the line activities such as read, program, or verify. In order to compensate for the slow reaction time of the generator 12, buffer 14 drives the current, thereby improving response time. However, the decrease in reaction time is counterbalanced by an increase in the constant energy consumed by circuit 10.

FIG. 1B illustrates another circuit 20 comprising a band gap reference generator 22, which supplies a band gap reference voltage, generally referenced 26, directly to an output 28. The voltage level of reference voltage 26 is generally equivalent to that of reference voltage 16'.

Generator 22 is a high power, low resistance driver which while consuming more energy than generator 12, reacts more quickly and stabilizes faster after changes in the line. Since generator 22 reacts quickly, circuit 20 eliminates the need for a buffer 14, while still supplying generally the same reference voltage as that supplied by circuit 10. Nevertheless, circuit 20 is a continuous high power consumer.

FIG. 1C is a prior art circuit taught in U.S. Pat. No. 5,568,085 to Eitan et al, and is included herein by reference. FIG. 1C illustrates circuit 30 comprising both low power generator 12, high power generator 22, and a NMOS switching transistor 32. Circuit 30 supplies a low power band gap voltage, generally referenced by an arrow 36, to an output 38. Alternatively, circuit 30 also supplies a high power band gap voltage, generally referenced by an arrow 36'.

The drain of transistor 32 is connected to high power generator 22 while the source of transistor 32 is connected to a ground source $V_{SS}$. The gate of transistor 32 is connected to a controlling line 34, which supplies a control signal $V_{CS}$. Control signal Vcs controls whether the high power generator 22 is off or providing high power band gap voltage 36' to output 38.

Low power generator 12 is always on, while high power generator 22, when so indicated, overrides the low power generator 12. The high power generator 22 is controlled by transistor 32 which is controlled by control signal $V_{CS}$.

When $V_{CS}$ is high, transistor 32 is activated, and therefore high power generator 22 is on, and supplies high power band gap voltage 36'. And when $V_{CS}$ is low, transistor 32 is deactivated, thus high power generator 22 is off, and only low power generator 22 supplies low power band gap voltage 36. In contrast to circuits 10 and 20 which are continuous high power consumers, circuit 30 from time to time consumes high power; only when the high power generator 22 is on. However, since there are two independent generators operating in circuit 30, there is an inherent mismatch in the band voltages 36 and 36'.

SUMMARY OF THE INVENTION

The present invention provides an improved circuit for providing a reference voltage.

There is therefore provided in accordance with a preferred embodiment of the present invention, a dual mode apparatus for alternately supplying a low power reference voltage and a high power reference voltage, both at the same voltage level. The apparatus includes a driver, an output buffer and a switch.

The driver generates the low power reference voltage, which is directly supplied during a standby mode of a receiving unit. The output buffer receives the low power reference voltage during an active mode of the receiving unit, and generates the high power reference voltage therefrom.

The switch is connected between an output of the driver and the output buffer, and provides the high power reference voltage during the active mode, and the low power reference voltage during the stand-by mode.

Preferably the switch is a break-before-make mechanism which breaks the connection to the output buffer before making the connection to the driver, and breaks the connection to the driver before making the connection to the output buffer.

Alternatively preferably, the switch is connected between the driver and the output buffer, and alternately connects and disconnects the output buffer and the driver. Preferably the switch includes means for connecting the output buffer to the driver during the active mode, and disconnecting the output buffer from the driver during the standby mode

BRIEF DESCRIPTION OF THE DRAWINGS

The present invention will be understood and appreciated more fully from the following detailed description taken in conjunction with the appended drawings in which:

FIGS. 1A–1C are schematic illustrations of prior art circuits;

DETAILED DESCRIPTION OF THE PRESENT INVENTION

Figure 2A:
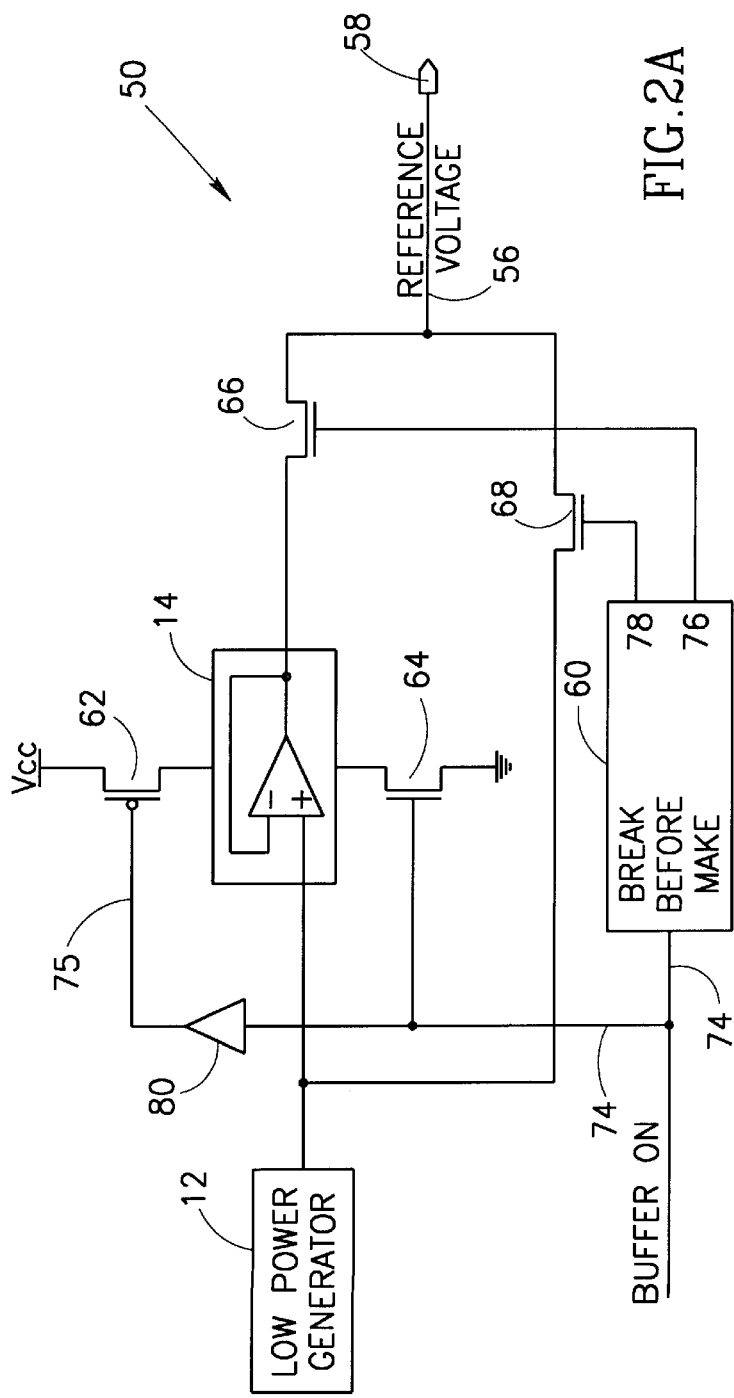
FIG. 2A is a schematic illustrations of a circuit constructed and operative in accordance with a preferred embodiment of the present invention.
Figure 2B:
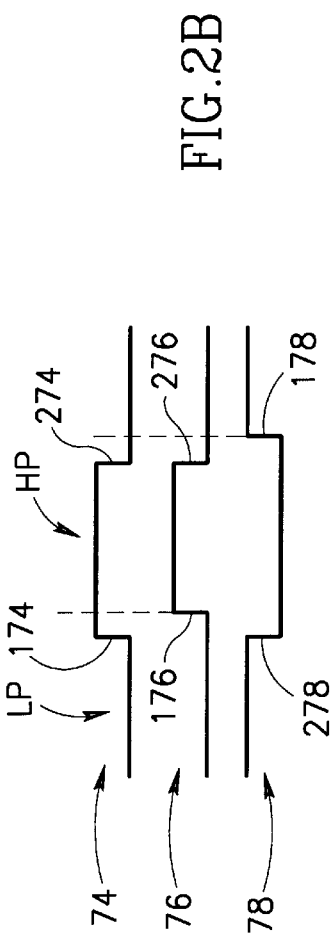
FIG. 2B is an illustration of the logic of the circuit illustrated in FIG. 2A.

Reference is now made to FIGS. 2A and 2B which illustrate a circuit 50 constructed and operative in accordance with a preferred embodiment of the present invention. Circuit 50 consumes less power than prior art circuits while still maintaining a quick reaction time to voltage changes in the line.

Circuit 50 supplies reference voltage 56 to an output, generally referenced 58. Circuit 50 comprises high impedance, low power generator 12 which supplies the reference voltage 56 to output 58 during standby modes, and low impedance output buffer 14 which supplies the reference voltage 56 to output 58 during active modes. In order to be energy efficient, generator 12 is a low power driver which is continuously on and consumes minimal energy, while high power buffer 14 is powered up only during active modes.

In a preferred embodiment, circuit 50 additionally comprises a break-before-make mechanism 60 which together with a series of switches, to be described in detail below, alternates between the generator 12 and the buffer 14, thereby alternating the path of reference voltage 56 and preventing the start-up noise generated by buffer 14 from reaching the generator 12. Break-before-make mechanism 60 is a typical logic mechanism often used to generate non-overlapping clocks, as described in *Analog Integrated Circuit Design* by David A. Johns and Ken Martin, John Wiley & Sons, Inc. 1997, Chapter 10, and in "Improved Circuits for the Realization of Switched-Capacitor Filters", *IEEE Trans. Circuits and Systems*, Vol. CAS - 27, pp. 237–244, April 1980 and enclosed herein by reference.

Circuit 50 provides the ability to alternatively switch between a low power reference generated by low power generator 12 during standby modes, and a high power reference voltage generated by low power generator 12 and buffer 14 during active modes. Thus circuit 50 enjoys the advantage of low impedance stability along with quick recovery from spikes and/or feedback from other circuits. The break-before-make mechanism 60 receives an input signal generally referenced 74 and generates output signals generally referenced 76 and 78. Additionally, circuit 50 comprises an inverter 80 which receives signal 74 and inverts it, generating a complement signal 75. Input signal 74, complement signal 75 and output signals 76 and 78 operate a series of switching transistors 64, 62, 66 and 68, respectively, which will be described in more detail hereinbelow.

Switching transistors 62, 64, 66 and 68 open and close the connections to and from buffer 14, consequently controlling the path of reference voltage 56. Preferably transistor 62 is a PMOS transistor and transistor 64 is a NMOS transistor. Transistors 66 and 68 are alternatively NMOS and/or PMOS transistors, as appropriate for the level of the reference voltage desired.

The sequencing and logic signals of the circuit 50 will be described in detail hereinbelow.

Reference is now briefly made to FIG. 2B, which illustrates the timing of input signal 74 and output signals 76 and 78, respectively. The timing schedule wherein circuit 50 is in standby mode is generally referenced in FIG. 2B as LP or low power, whereas, the timing schedule wherein circuit 50 is performs functions such as read, write or verify, is generally designated as HP or high power.

It is noted that when input signal 74 goes high, generally designated by a rise line 174, output signal 78 goes low, generally designated by a fall line 278. Conversely, when input signal 74 goes low, generally designated by a fall line 274, output signal 76 goes low, generally designated by a fall line 276. It is furthermore noted that the timing schedule of complement signal 75, not shown in FIG. 2B, is the complement of input signal 74.

Additionally it is noted that the timing of the output signals 76 and 78 are not in exact sync with each other, rather fall line 278 occurs slightly before output signal 76 goes high, generally designated by a rise line 176. Similarly fall line 276 occurs slightly before output signal 78 goes high, generally designated by a rise line 178.

As illustrated in FIG. 2A, input signal 74 is received by the gate of transistor 64, and controls the operations of transistor 64. Similarly complement signal 75 is received by the gate of transistor 62 and controls the operations of that transistor. Transistors 62 and 64 open and close the circuit connection between power Vcc and buffer 14, thereby effectively regulating the power input to buffer 14.

The output signal 76 is received by the gate of transistor 66, thereby controlling the operations of transistor 66, while output signal 78 is received by the gate of transistor 68 and controls the operations of that transistor.

When the input signal 74 goes high, i.e. during read, program or verify activities, generally simultaneously complement signal 75 goes low, causing NMOS transistor 64 and PMOS transistor 62, respectively, to be activated, closing the circuit connection to buffer 14 and hence, buffer 14 is turned on. Simultaneously, the output signal 78 of mechanism 60 goes low, deactivating NMOS transistor 68 and "breaking" the circuit connection between lower power generator 12 and output 58. Shortly after output signal 78 goes low, output signal 76 goes high, activating transistor 66 and "making" the circuit connection between buffer 14 and output 58.

It is noted that the connection between generator 12 and output 58 is "broken" before the connection between buffer 14 and output 58 is "made". Hence, circuit 50 prevents the noise feedback created by buffer 14 during the power-up from reaching generator 12.

Additionally as illustrated in FIG. 2B, when input signal 74 goes low, and complement signal 75 goes high, transistors 64 and 62, respectively, are deactivated, and thus buffer 14 is disconnected from the circuit. Simultaneously, the output signal 76 of mechanism 60 goes low, deactivating transistor 66 and breaking the circuit connection between buffer 14 to output 58. Shortly after output signal 76 goes low, output signal 78 goes high, activating transistor 68 and making the circuit connection between low power generator 12 and output 58.

It should be noted that the connection between buffer 14 and output 58 is "broken" before the connection between generator 12 and output 58 is "made". Hence, circuit 50 prevents generator 12 from receiving feedback noise as created by the power-down of buffer 14.

It should be additionally noted that if the switching connection between high impedance, low power generator 12 and output 58 is not broken before the activation of low impedance buffer 14, than circuit 50 will suffer from possible spikes in the line. As such, in an embodiment of the present invention, the timing and the combination of break-before-make mechanism 60 together with transistors 62, 64, 66, and 68, provides a method and apparatus for preventing such disturbances in the line.

In the preferred embodiment presented hereinabove, for a short period time between the break and the make of circuit 50, there is no driver supplying the reference voltage 56. However, since this time period is so short, and since the circuit is a capacitive circuit, reference voltage 56 is not affected.

It will be appreciated by persons skilled in the art that the present invention is not limited by what has been particularly shown and described herein above. Rather the scope of the invention is defined by the claims which follow:

What is claimed is:

1. A dual mode apparatus for alternately supplying a low power reference voltage and a high power reference voltage, said apparatus comprising:

a driver which generates said low power reference voltage and directly supplies said low power reference voltage during a standby mode of a receiving unit;

an output buffer which receives said low power reference voltage and generates said high power reference voltage therefrom during an active mode of said receiving unit; and a switch which is connected to an output of said drive and said output buffer to provide said high power reference voltage during said active mode, and said low power reference voltage during said stand-by mode, and wherein said switch is a break-before-make mechanism which breaks said connection to said output buffer before making said connection to said driver and which breaks said connection to said driver before making said connection to said output buffer, thereby protecting against disturbances in the line resulting from high impedance and low impedance mismatching.

2. A dual mode apparatus for alternately supplying a low power reference voltage and a high power reference voltale, said apparatus comprising:

a driver which generates said low power reference voltage and directly supplies said low power reference voltage to a receiving unit during a standby mode of said receiving unit;

an output buffer which receives said low power reference voltage and supplies said high power reference voltage to said receiving circuit during an active mode of said receiving unit;

a switch which is connected between a power input and said output buffer, and which alternately connects and disconnects said output buffer with said power input; and wherein said switch comprises means for connecting said output buffer to said power input during said active mode, and disconnecting said output buffer from said power input during said standby mode.

* * * * *

UNITED STATES PATENT AND TRADEMARK OFFICE
CERTIFICATE OF CORRECTION

PATENT NO.  : 6,118,267
DATED       : September 12, 2000
INVENTOR(S) : Boaz Eitan and Hans Nachmann It is certified that error appears in the above-identified patent and that said Letters Patent is hereby corrected as shown below:

Title page,
"Assignee," after "Saifun Semiconductors, Ltd., Netanya, Israel," add -- Tower Semiconductors, Ltd., Migdal Haemek, Israel. --

Signed and Sealed this

Twenty-eighth Day of August, 2001

*Attest:*

NICHOLAS P. GODICI
*Acting Director of the United States Patent and Trademark Office*

*Attesting Officer*